(12) United States Patent
Daggett et al.

(10) Patent No.: US 7,238,239 B2
(45) Date of Patent: Jul. 3, 2007

(54) LIQUID COATING DEVICE WITH BAROMETRIC PRESSURE COMPENSATION

(75) Inventors: Joseph W. Daggett, Dallas, TX (US); Daniel J. Williams, Plano, TX (US); Kevin G. Kemp, Dallas, TX (US); Joseph W. Cayton, Frisco, TX (US)

(73) Assignee: FSI International, Inc., Chaska, MN (US)

( * ) Notice: Subject to any disclaimer, the term of this patent is extended or adjusted under 35 U.S.C. 154(b) by 672 days.

(21) Appl. No.: 10/628,598

(22) Filed: Jul. 28, 2003

(65) Prior Publication Data

US 2004/0216664 A1    Nov. 4, 2004

Related U.S. Application Data

(60) Division of application No. 09/397,714, filed on Sep. 16, 1999, now Pat. No. 6,599,560, which is a continuation-in-part of application No. 08/961,175, filed on Oct. 30, 1997, now abandoned.

(51) Int. Cl.
| | |
|---|---|
| B05C 11/02 | (2006.01) |
| B05C 11/00 | (2006.01) |
| B05C 5/00 | (2006.01) |
| B05B 1/28 | (2006.01) |

(52) U.S. Cl. .................. 118/679; 118/712; 118/52; 118/326; 118/300

(58) Field of Classification Search ............. 118/663, 118/665, 667, 679, 683, 684, 688, 712, 52, 118/319, 320, 612, 692, 300, 326; 427/8, 427/9, 240; 396/611, 627

See application file for complete search history.

(56) References Cited

U.S. PATENT DOCUMENTS

| | | | |
|---|---|---|---|
| 4,932,353 A | 6/1990 | Kawata et al. | |
| 5,127,362 A | 7/1992 | Iwatsu et al. | |
| 5,211,753 A | 5/1993 | Swain | |
| 5,366,757 A | 11/1994 | Lin | |
| 5,416,047 A | 5/1995 | Konishi et al. | |
| 5,626,679 A | 5/1997 | Shimizu et al. | |
| 5,685,908 A * | 11/1997 | Brytsche et al. | .............. 118/52 |
| 5,766,671 A | 6/1998 | Matsui | |
| 5,777,300 A * | 7/1998 | Homma et al. | ............. 219/679 |
| 5,985,357 A * | 11/1999 | Sanada | ........................... 427/8 |
| 6,177,133 B1 | 1/2001 | Gurer et al. | |
| 6,254,936 B1 * | 7/2001 | Gurer et al. | ................. 427/377 |
| 6,599,560 B1 | 7/2003 | Daggett et al. | |

FOREIGN PATENT DOCUMENTS

| | | |
|---|---|---|
| JP | 3-178123 | 8/1991 |
| JP | 4-94525 | 3/1992 |
| JP | 05-144721 | 6/1993 |

OTHER PUBLICATIONS

Uchiyama, Photoresist Application Device, JP 5-144721 (English Translation), Jun. 1993, pp. 1-10.

Gürer, et al. "Model-based adaptive process control: A CD-control example," Solid State Technology, pp. 205-206, 208, 210, 212 (Jul. 1996).

Gürer, et al., ". . . Adaptive Process Control in Lithography," Semicon Korea 98, Semicon Korea Technical Symposium 98, Process & Evaluation Technology, I, II, pp. 205-218.

* cited by examiner

*Primary Examiner*—Yewebdar Tadesse
(74) *Attorney, Agent, or Firm*—Kagan Binder, PLLC

(57) ABSTRACT

A liquid coating device and method for coating a coatable composition on a workpiece to form a coating, wherein a parameter indicative of barometric pressure is measured and at least one thickness-affecting process parameter is adjusted in order to compensate for the effects of variations in barometric pressure on coating thickness uniformity.

20 Claims, 4 Drawing Sheets

LIQUID COATING DEVICE WITH BAROMETRIC PRESSURE COMPENSATION

REFERENCE TO RELATED APPLICATION

This application is a divisional of U.S. patent application Ser. No. 09/397,714, filed Sep. 16, 1999, now U.S. Pat. No. 6,599,560, which is a continuation-in-part of U.S. patent application Ser. No. 08/961,175, filed Oct. 30, 1997, abandoned, and which are incorporated herein by reference in their entirety.

FIELD OF THE INVENTION

This invention is in the field of liquid coating devices for forming a uniform coating of a coatable composition on a workpiece, such as a semiconductor wafer. More specifically, this invention relates to improvements in coating thickness uniformity by compensating for variations in barometric pressure.

BACKGROUND OF THE INVENTION

In the process of fabricating microelectronic devices such as semiconductor integrated circuits, certain steps typically must be limited to well-defined regions of the semiconductor wafer. These regions must be precisely delimited and the other areas of the wafer must be protected from the action of a particular fabrication step.

Photolithography is a common method of selectively protecting areas of a wafer. According to this approach, a coating of photosensitive photoresist is first layered on the wafer. One method of applying the photoresist coating is spin processing. A spin coater is used for this purpose. The spin coater places a suitable quantity, typically 1 ml to 4 ml, of photoresist in the center of a wafer spinning at an initial rotational speed, e.g., 1000 rpm to 1500 rpm. At some point after the photoresist is placed on the wafer, the rotational speed of the wafer is ramped up to a final spin speed. Typically, the wafer is spun by a chuck to which the wafer is attached by vacuum suction or the like. Centrifugal force causes the photoresist to spread out over the surface of the spinning wafer.

After the photoresist coating is layered on the wafer, it is exposed to light through a photomask. The photomask is formed of a thin metal film or the like having a desired pattern that selectively allows light to pass through the mask and expose the photoresist coating. If the photoresist is of a so-called negative type, the exposed photoresist coating is developed by dissolving and washing away the unexposed regions. If the photoresist is of a so-called positive type, the exposed photoresist coating is developed by dissolving and washing away the exposed regions. In both types of photolithography, the remaining photoresist forms the protective mask on the wafer.

In photolithography processing, it is important to maintain a uniform photoresist coating thickness. To form high-quality semiconductors, not only should the photoresist coating be uniform throughout the entire surface of a single wafer (referred to herein as "intra-wafer uniformity"), the photoresist coating also should be uniform from wafer to wafer (referred to herein as "wafer-to-wafer uniformity" or simply "uniformity"). It is known that the thickness of a photoresist coating depends on many factors including viscosity and temperature of the photoresist solution, spin speed, bake temperature, bake time, bake pressure, process timing delays, spin acceleration, air velocity, humidity, temperature, and pump parameters.

Previous efforts at increasing coating thickness uniformity focused on the temperature and humidity factors because these factors have a significant impact on coating thickness and can be directly controlled in a relatively inexpensive, straightforward manner. For example, to directly control the effects of temperature and humidity, processing can be carried out in an environmental chamber in which the temperature and humidity are maintained at pre-selected, constant levels so that the uniformity variations due to temperature and humidity are avoided.

In addition to directly controlling the temperature and humidity, another approach is to measure the temperature or humidity and then control a different process parameter such as the spin speed, the temperature of the photoresist, and/or the temperature of the wafer in order to achieve uniformity and compensate for temperature and humidity variations. Such an indirect approach is shown in U.S. Pat. No. 5,127, 362 (1992) issued to Iwatsu et al. The approach described in Iwatsu involves measuring the temperature and/or the humidity, and then adjusting the spin speed, the temperature of the photoresist, and/or the temperature of the wafer in response to the measured temperature and/or humidity.

The problem with controlling, or compensating for, temperature and/or humidity is that there is an inherent limit to the level of uniformity that is attainable by relying on only these two inputs. As tolerances for circuits manufactured upon semiconductor wafers become more demanding, other factors must be addressed to achieve greater levels of photoresist thickness uniformity.

SUMMARY OF THE INVENTION

An object of the present invention is to provide a liquid coating device and method which can form coatings having a uniform thickness from substrate to substrate and is inexpensive.

Effects from factors other than temperature and humidity perhaps could have remained unappreciated and have been safely ignored when photoresist coating tolerances were less demanding. But as semiconductor devices have become increasingly complex and tolerances more demanding, these once-ignored factors must be accounted for in order to achieve greater photoresist thickness uniformity. One especially important factor is the barometric pressure of the processing environment. Barometric pressure and coating thickness are inversely related. If the barometric pressure of the processing environment is relatively high, then the resulting coating will be thinner than desired. Likewise, if the barometric pressure of the processing environment is relatively low, then the resulting coating will be thicker than desired. Therefore, by compensating for barometric pressure variations, more demanding thickness uniformity tolerances can be achieved.

Accordingly, this invention relates to a system for coating a coatable composition on a workpiece that addresses the non-uniformities introduced by variations in the barometric pressure of the processing environment in order to achieve a greater degree of coating uniformity.

Addressing the effects from barometric pressure variations is different, however, than addressing the effects from temperature and humidity variations. There are relatively inexpensive and straightforward methods of directly controlling temperature and humidity, e.g., using an environmental chamber to maintain a constant temperature and humidity during processing. However, it is more expensive and difficult to directly set the barometric pressure at a constant, consistent level. Therefore, an indirect method of compensating for the effects of barometric pressure is preferable.

The preferred embodiment of the present invention discloses an indirect approach for compensating for the effects of barometric pressure on coating thickness uniformity in coating operations. Specifically, at least one thickness-affecting process parameter is adjusted to compensate for variations in the barometric pressure during coating of a coatable composition onto a workpiece, thereby obtaining a more uniform coating thickness. For example, it is known that a number of controllable process parameters such as coating speed, spin speed of the workpiece in the context of spin coating, photoresist temperature, environmental temperature, relative humidity, and workpiece temperature can have an effect upon photoresist coating thickness. If the measured barometric pressure suggests that the coating thickness might end up too thick, one or more of such process parameters or the like can be adjusted in a manner tending to decrease coating thickness so as to compensate for barometric pressure effects. Conversely, if the measured barometric pressure suggests that the coating thickness might end up too thin, one or more process parameters or the like can be adjusted in a manner tending to increase coating thickness so as to compensate for barometric pressure effects.

One or more process parameters may be controllably adjusted in order to compensate for barometric pressure effects. Generally, choosing the number of parameters to adjust depends upon the parameters at issue. Some parameters provide excellent adjustment results when controlled singly, whereas others might tend to provide the best results when controlled in concert with other parameters. For instance, spin speed is a process parameter that can be controlled singly in order to compensate for barometric pressure effects while holding other process parameters substantially constant. On the other hand, parameters such as the composition temperature, the workpiece temperature, and the surrounding chamber temperature are advantageously adjusted as a trio in concerted fashion in order to compensate for barometric pressure effects.

In a particularly preferred implementation of this approach, a correlation between coating thickness and barometric pressure can be determined as a function of a parameter, such as spin speed for example, while holding temperature, humidity, and/or other controllable process parameters at convenient, constant values. Coating would then be carried out at those constant values at a particular spin speed effective to achieve the desired thickness for the currently measured barometric pressure. This embodiment involves spin speed as the process parameter to be controllably adjusted, but any of the other controllable parameters could have been chosen for this role as well.

In one aspect, the present invention relates to a liquid coating device for coating a fluid composition on a surface of a workpiece to form a coating. The device comprises processing chamber including a coating enclosure within which the workpiece is supported during coating operations. A pressure communicative conduit operatively couples a pressure sensor to the interior of the coating enclosure such that a pressure signal generated by the pressure sensor is indicative of the pressure inside the coating enclosure. A control system is coupled to the sensor and adapted to control at least one thickness-affecting process parameter via an output control signal. The control system comprises componentry that enables the control system to derive the output control signal from information comprising the generated pressure signal.

In another aspect, the present invention relates to a method of coating a workpiece with a fluid composition thereby forming a coating on a surface of the work-piece. Specifically, the method involves the steps of positioning the workpiece inside a coating enclosure. An exteriorly positioned pressure sensor is operatively coupled to the interior of the coating enclosure via a pressure communicative conduit in a manner such that a pressure signal generated by the pressure sensor is indicative of the pressure inside the coating enclosure comprising the following steps. A process coating parameter is then adjusted to a setting corresponding to the desired coating thickness, wherein the setting is determined from information comprising the generated pressure signal. The workpiece surface is then coated with the fluid composition, wherein at least a portion of the coating step occurs while the process coating parameter is at said setting.

BRIEF DESCRIPTION OF THE DRAWINGS

The above mentioned and other advantages of the present-invention, and the manner of attaining them, will become more apparent and the invention itself will be better understood by reference to the following description of the embodiments of the invention taken in conjunction with the accompanying drawings, wherein.

DETAILED DESCRIPTION OF THE PRESENTLY PREFERRED EMBODIMENTS

The embodiments of the present invention described below are not intended to be exhaustive or to limit the invention to the precise forms disclosed in the following detailed description. Rather the embodiments are chosen and described so that others skilled in the art may appreciate and understand the principles and practices of the present invention. In other words, for purposes of illustration, the system shown is for spin coating a photoresist onto a microelectronic device such as a semiconductor wafer, a flat panel display, or a thin film head. But, the present invention can be used for any coating operation, e.g., extrusion or spray coating, in which a coatable composition is coated onto a workpiece. For purposes of illustration the workpiece referred to herein is a wafer.

There are several convenient, directly controllable process parameters that affect the thickness of a coating. These process parameters typically include temperature of the coatable composition at the time of coating, temperature of the workpiece, chamber humidity, chamber temperature, and, in the case of spin coating, spin speed, spin duration, delay from photoresist dispensing to initiation of spin ramp-up, ramp-up duration, and spin acceleration during ramp-up. In the present invention, one or more of these thickness-affecting process parameters are adjusted in response to measured variations in barometric pressure so that any non-uniformities introduced by the variations in barometric pressure are compensated for by adjusting the at least one thickness-affecting parameter. In the preferred embodiment, the at least one thickness-affecting process parameter is spin speed. Spin speed is preferred because it is easily controllable, and adjusting only one thickness-affecting process parameter reduces the complexity of the system.

Figure 1:
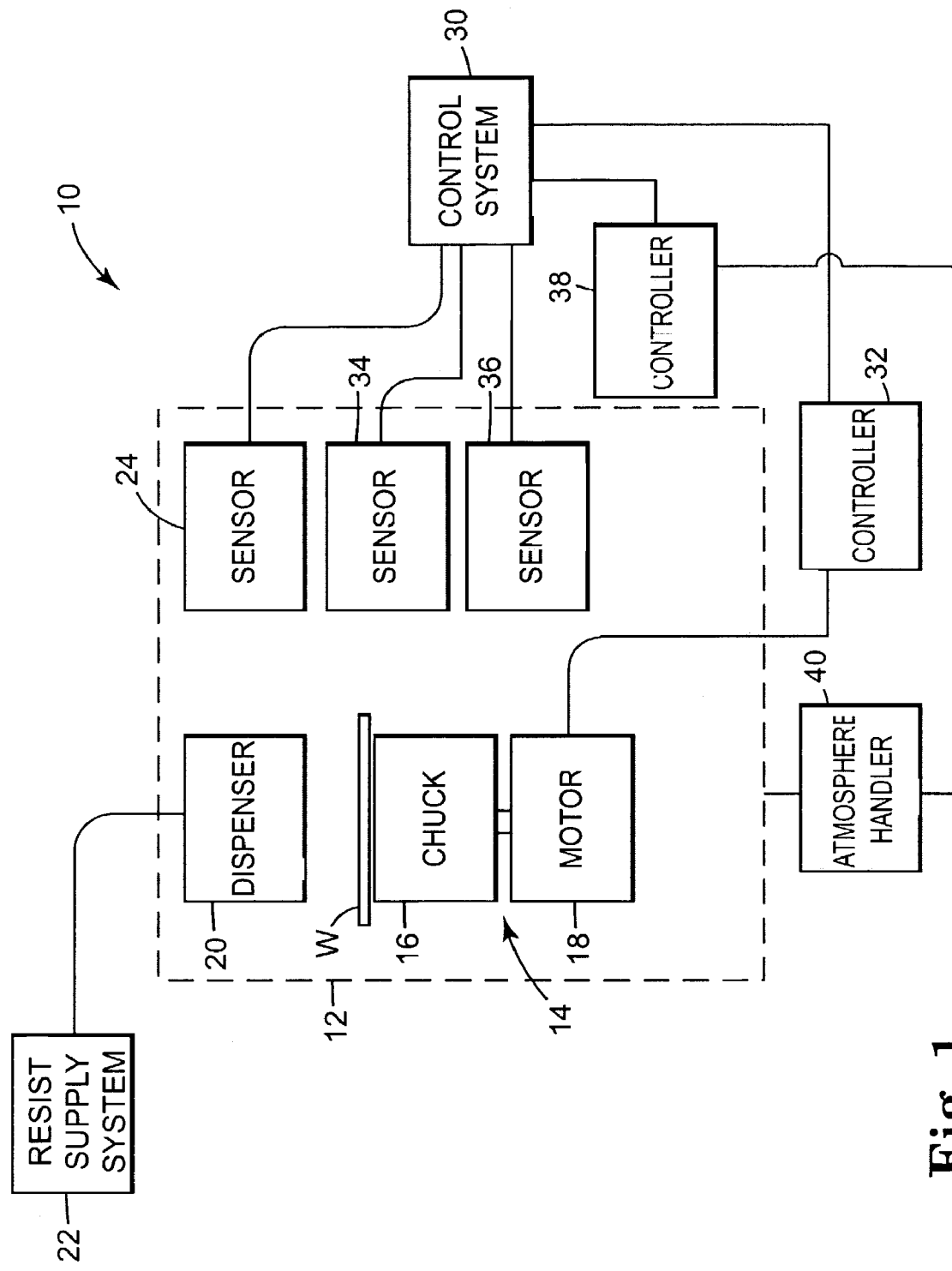
FIG. 1 is a block diagram showing a spin coating device according to an embodiment of the present invention.

For instance, a liquid coating device 10 is shown in block diagram form in FIG. 1. The device 10 is adapted to controllably adjust spin speed in order to compensate for barometric pressure effects. The device 10 includes an environmental chamber 12 housing a rotatable support member 14, which comprises a chuck 16 connected to a motor 18. A wafer W is mounted by means of vacuum suction or the like (not shown) to the chuck 16. The wafer W and chuck 16 are rotated by the motor 18 during spin coating.

Figure 2:
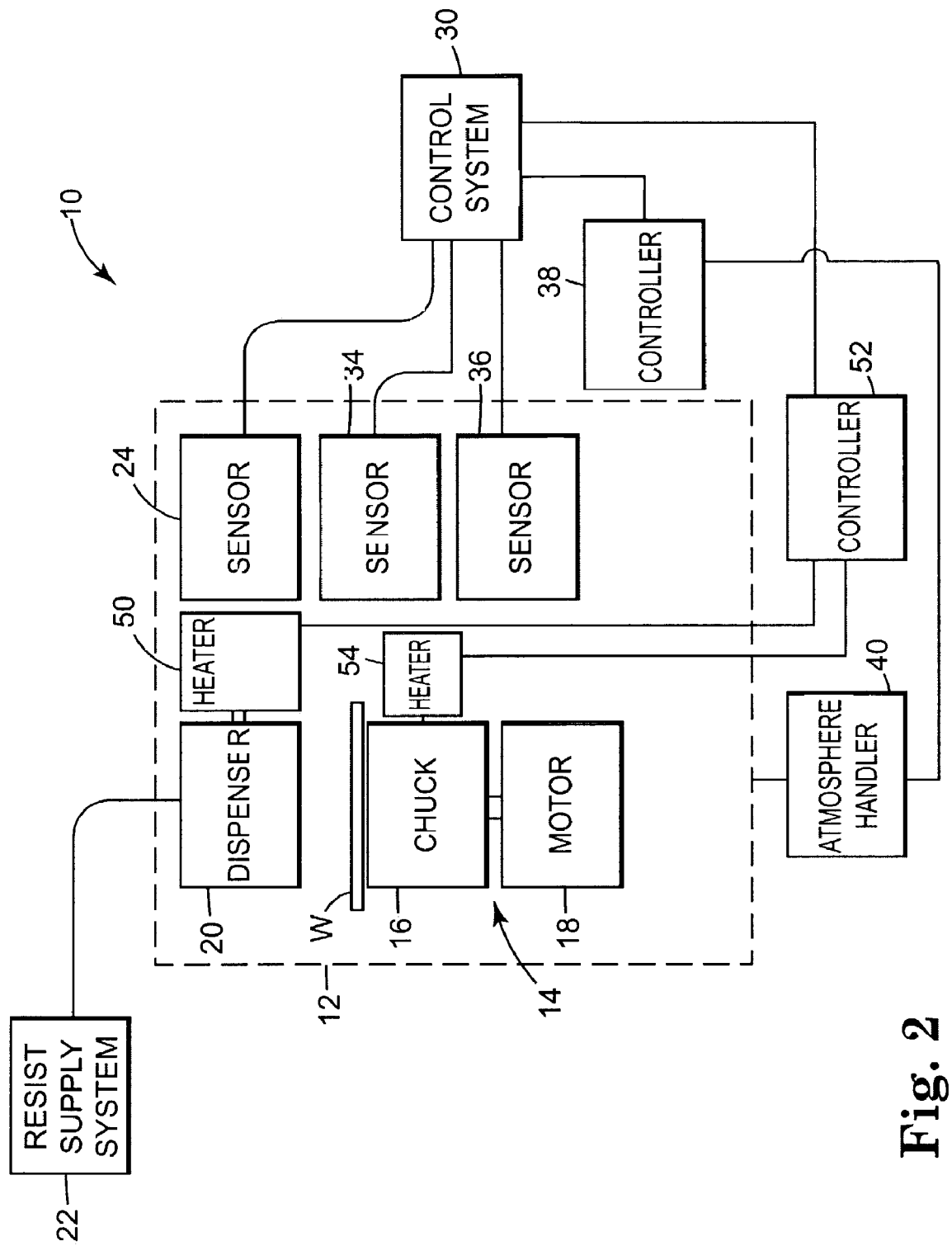
FIG. 2 is a block diagram showing a spin coating device according to an alternative embodiment of the present invention.

Above an exposed surface of the wafer W, is a dispenser 20 for providing a predetermined amount of a photoresist onto the wafer W. The dispenser 20 is connected to a photoresist supply system 22. The dispenser 20 and photoresist supply system 22 are of conventional design and adapted to use conventional techniques to maintain the photoresist in a condition so that the photoresist may be freely supplied through the dispenser 20 onto the surface of the wafer W during spin coating. For example, as illustrated in FIG. 2, the dispenser 20 can include a photoresist heater 50 for maintaining a desired photoresist temperature. A suitable dispenser and photoresist supply system for use in the systems of FIG. 1 or FIG. 2 can be found in the POLARIS® photolithography cluster manufactured by FSI International, Inc., Chaska, Minn.

Referring again to FIG. 1, the dispenser 20, the photoresist supply system 22, and the rotatable support member 14 are adapted as necessary to allow convenient access to the chuck 16 so that the wafer W can be mounted on and removed from the chuck 16 quickly and easily.

A barometric pressure sensor 24 is located within, or proximal to, the device 10 so that the barometric pressure sensor 24 can measure some parameter indicative of the barometric pressure inside the environmental chamber 12, preferably in such a way that the measured parameter is indicative of barometric pressure near the wafer W. For example, when using the POLARIS® cluster a suitable placement is within the coater module in a non-turbulent, shrouded position so as to eliminate air flow effects upon the sensor 24. The particular design of the barometric pressure sensor 24 is not critical; any sensor capable of detecting a parameter indicative of barometric pressure inside the environmental chamber 12 can be used. In the preferred embodiment, the barometric pressure sensor 24 is a PTB 100 series analogue barometer manufactured by Vaisala Oy, Helsinki, Finland.

An output signal of the barometric pressure sensor 24 is input into a control system 30. The control system 30 includes componentry, which could be hardware, software, or a combination of both, that uses the signal from the barometric pressure sensor 24 to generate an output signal that corresponds to a setting of the at least one thickness-affecting process parameter sufficient to achieve the desired uniformity and/or coating thickness at the measured barometric pressure. In the preferred embodiment, the control system 30 includes program instructions, i.e. software, that contain reference data relating the measured barometric pressure parameter to a desired spin speed appropriate to compensate for the barometric pressure effects proximal to the wafer W. The control system 30 then generates an output signal corresponding to the desired spin speed, and the output signal is input to a rotational speed controller 32. The rotational speed controller 32 sets the rotational speed of the motor 18 to the spin speed dictated by the signal from the control system 30. FIG. 1 shows the rotational speed controller 32 separate from the control system 30 and the motor 18, but this configuration is in no way critical. Any convenient setup could be used. For example, the rotational speed controller 32 could be integrated into the control system 30 or the motor 18.

An environmental chamber 12 encloses the apparatus so that desired environmental conditions suitable for applying photoresist onto a wafer W can be maintained and/or controllably adjusted. Thus, the environmental chamber 12 allows the temperature and humidity of the chamber 12 to be set at particular values for carrying out the processing. By holding these factors constant, variations in temperature and humidity that would cause photoresist thickness to vary are avoided. The environmental chamber 12 also serves as a barrier against particulates and other contaminants. In addition, the chamber 12 is adapted to allow access to the interior of the chamber 12 so that the wafer W can be mounted on and removed from the chuck 16.

The chamber 12 further includes chamber temperature and humidity sensors 34 and 36 that provide input signals to the control system 30 so that chamber temperature and relative humidity can be controlled as desired. To accomplish this, the device 10 further includes a remote atmosphere handler 40 in fluid communication with the chamber 12 and adapted to process atmosphere in the chamber 12 in order to establish desired temperature and humidity within the chamber 12. A suitable atmosphere within the chamber 12 depends on the type of coating process and coatable composition used. For example, the atmosphere can be air or an inert gas such as He, Ar, $N_2$, or the like or a combination thereof. An atmosphere handler controller 38 supplies a signal to the remote atmosphere handler 40 in accordance with a signal generated by the control system 30 in response to input signals supplied from the chamber temperature and humidity sensors 34 and 36. In the preferred embodiment, the remote atmosphere handler 40 is designed to establish the desired chamber temperature and humidity by first chilling the atmosphere to be circulated into the chamber 12 in order to dry the atmosphere. Once dried, the atmosphere is heated and humidified to the desired temperature and humidity level. The processed atmosphere is then transferred into the chamber 12. As an option, a re-circulation loop could also be used to partially re-circulate the atmosphere from the chamber 12 back to the remote atmosphere handler 40.

In FIG. 1 the control system 30 is shown as a single unit. The control system 30 could also, however, comprise multiple control systems. For instance, in the preferred embodiment separate control systems operate the remote atmosphere handler 40 and the rotatable support member 14 independently.

Methods for forming a photoresist coating having a uniform thickness using the liquid coating device of FIG. 1 will be described below.

In a preferred mode of operation of the device 10, chamber humidity and temperature, photoresist temperature, and wafer temperature are set at particular values. For these values, reference data giving photoresist thickness as a function of spin speed over a range of barometric pressure conditions is obtained empirically. Nominal barometric pressure is dependent on altitude, for example, at sea level nominal barometric pressure is 1,013 millibars whereas at 10,000 feet above sea level nominal barometric pressure is 695 millibars, with the actual, measured barometric pressure varying within 50 millibars above and below the nominal barometric pressure. Thus, empirical data preferably is obtained over about a 100 millibar range extending 50 millibars above and below the nominal barometric pressure at the particular site where coating is to occur. With this reference data, a spin speed needed to achieve the desired photoresist thickness at a measured barometric pressure can be easily determined. This determination can be made in any convenient manner such as by using a look-up table, by developing a formula using regression analysis or other curve fitting techniques, or the like. Preferably, the determination is made by performing least squares regression analysis to develop a linear approximation of a spin speed needed to get a desired coating thickness given a particular measured barometric pressure.

A wafer W (100 mm to 300 mm in diameter most typically) is mounted on the chuck 16. A predetermined amount of the photoresist (e.g., 1 ml to 4 ml) at a predetermined temperature (e.g., 18° C. to 25° C. or preferably within 3° of ambient temperature) is supplied from the photoresist supply system 22 via a conduit and dropped on the center of the wafer W while it rotates at an initial, relatively low rotational speed, e.g., 1000 rpm to 1500 rpm. The spin speed is then ramped up to a final spin speed, e.g., 2000 rpm to 5000 rpm; needed to obtain the desired coating thickness. The final spin speed is determined by the control system 30 in response to a signal from the barometric pressure sensor 24 in order to compensate for barometric pressure effects proximal to the workpiece W.

Figure 3:
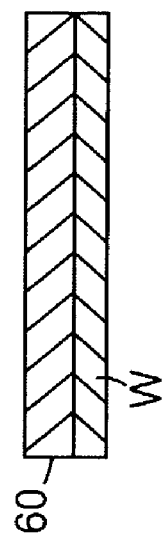
FIG. 3 is a sectional view of a workpiece coated with a coatable composition at an optimal barometric pressure.
Figure 4:
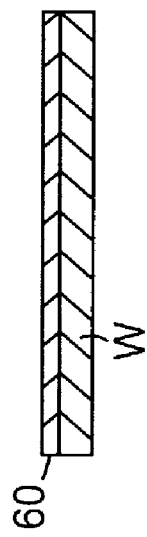
FIG. 4 is a sectional view of a workpiece coated with a coatable composition at a higher than optimal barometric pressure.

For example, if the barometric pressure in the chamber 12 is higher than an optimal barometric pressure for forming a photoresist coating 60 having the desired mean coating thickness, the dropped photoresist would tend to form a photoresist coating 60, as shown in FIG. 4, having a mean coating thickness that would be lower than the desired mean coating thickness if no adjustments were made. In such a situation, however, the barometric pressure sensor 24 detects the higher barometric pressure and sends an output signal to the control system 30. The control system 30 would then derive a relatively slow final spin speed from information comprising the sensed barometric pressure and the reference data. In accordance with the derived final spin speed, the control system 30 sends an output signal to the rotational speed controller 32. The rotational speed controller 32 sets the rotational speed of the motor 18 to match the final spin speed derived by the control system 30. A slower spin speed tends to produce a thicker photoresist coating 60. Therefore, as a result of the relatively slow spin speed, the mean coating thickness .of the photoresist coating 60 increases to the desired mean coating thickness as shown in FIG. 3.

Figure 5:
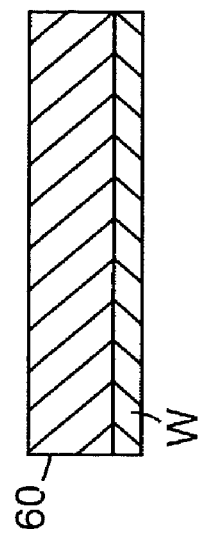
FIG. 5 is a sectional view of a workpiece coated with a coatable composition at a lower than optimal barometric pressure.

Still referring primarily to FIG. 1, if the barometric pressure in the chamber 12 is lower than the optimal barometric pressure, the provided photoresist would tend to form a photoresist coating 60 on the wafer W, as shown in FIG. 5, having a mean coating thickness higher than the desired mean coating thickness if no adjustments were made. In such a situation, however, the barometric pressure sensor 24 detects the lower barometric pressure and sends an output signal to the control system 30. The control system 30 would then derive a relatively fast final spin speed from information comprising the sensed barometric pressure and the reference data. In accordance with the final spin speed, the control system 30 sends an output signal to the rotational speed controller 32. The rotational speed controller 32 sets the rotational speed of the motor 18 to match the final spin speed derived by the control system 30. A faster spin speed tends to produce a thinner photoresist coating 60. Therefore, as a result of the relatively fast final spin speed, the mean coating thickness of the photoresist coating 60 decreases to the desired coating thickness shown in FIG. 3.

An alternative method of operating the device 10 shown in FIG. 1 involves controllably varying a process timing delay such as the period occurring from the time of dispensing the photoresist to the time of initiating spin speed ramp-up. The method is similar to the spin speed method described above except as follows. When the barometric pressure sensor 24 detects a higher barometric pressure, the sensor 24 sends an output signal to the control system 30. The control system 30 derives an appropriate process timing delay from information comprising the sensed barometric pressure and corresponding reference data. In accordance with the new process timing delay, the control system 30 sends an output signal to the rotational speed controller 32. The rotational speed controller 32 adjusts the time for initiating the spin-speed ramp-up after the photoresist is delivered from the photoresist supply system 22 in accordance with the new process timing delay provided by the control system 30. A longer process timing delay tends to produce a thicker photoresist coating 60. Therefore, as a result of the relatively long process timing delay, the mean coating thickness of the photoresist coating 60 increases to the desired mean coating thickness as shown in FIG.3.

Likewise when the barometric pressure sensor 24 detects a lower barometric pressure, the sensor 24 sends an output signal to the control system 30. The control system 30 would derive an appropriate-process timing delay from information comprising the sensed barometric pressure and corresponding reference data. In accordance with the new process timing delay, the control system 30 sends an output signal to the rotational speed controller 32. The rotational speed controller 32 adjusts the time for initiating the spin speed ramp-up after the photoresist is delivered from the photoresist supply system 22 in accordance with the new process timing delay provided by the control system 30. A shorter process timing delay tends to produce a thinner photoresist coating 60. Therefore, as a result of the relatively short process timing delay, the mean coating thickness of the photoresist coating 60 decreases to the desired mean coating thickness as shown in FIG. 3.

Yet another method of operating the device 10 shown in FIG. 1 involves controllably adjusting the spin duration. The method is similar to the spin speed method described above except as follows. When the barometric pressure sensor 24 detects a higher barometric pressure, the sensor 24 sends an output signal to the control system 30. The control system 30 would derive an appropriate spin duration from information comprising the sensed barometric pressure and corresponding reference data. In accordance with the derived spin duration, the control system 30 sends an output signal to the rotational speed controller 32. After ramping-up the spin speed, the rotational speed controller 32 spins the wafer W at a final spin speed for the duration provided by the control system 30. A shorter spin duration tends to produce a thicker photoresist coating 60. Therefore, as a result of the relatively short spin duration, the mean coating thickness of the photoresist coating 60 increases to the desired mean coating thickness as shown in FIG. 3.

Likewise, when the barometric pressure sensor 24 detects a lower barometric pressure, the sensor 24 sends an output signal to the control system 30. The control system 30 would derive an appropriate spin duration from information comprising the sensed barometric pressure and corresponding reference data. In accordance with the derived spin duration, the control system 30 sends an output signal to the rotational speed controller 32. After ramping-up the spin speed, the rotational speed controller 32 spins the wafer W at a final spin speed for the duration provided by the control system 30. A longer spin duration tends to produce a thinner photoresist coating 60. Therefore, as a result of the relatively long spin duration, the mean coating thickness of the photoresist coating 60 increases to the desired mean coating thickness as shown in FIG. 3.

Instead of controlling a single process parameter, more than one thickness-affecting parameters could be controlled in a concerted fashion according to a signal generated by the barometric pressure sensor 24. Such an approach is demonstrated in an alternative embodiment of a liquid coating device 10 shown in FIG. 2. The device 10 of FIG. 2 is similar to the device depicted in FIG. 1, except the device 10 of FIG. 2 includes a photoresist heater 50 and a workpiece heater 54 operationally coupled to chuck 16 so that the controllably adjusted, thickness-affecting parameters are photoresist temperature, workpiece temperature, and chamber temperature instead of spin speed, process timing delay, or spin duration. The device 10 also includes feedback sensors (not shown) thermally coupled to the dispenser 20 and the chuck 16 to sense temperature indicative of the temperature of the photoresist and the workpiece W supported on the chuck 16.

FIG. 2 shows a control system 30 that is operationally coupled to a temperature controller 52 and an atmosphere handler controller 38 so that the chamber, workpiece, and photoresist temperatures can be varied in a concerted fashion in order to compensate for barometric pressure effects. The temperature controller 52 receives a signal from the control system 30 directing the temperature controller 52 to adjust the temperature of the photoresist provided from the dispenser 20 by setting the temperature of the photoresist heater 50. The photoresist heater 50 is located within the dispenser 20 or the photoresist supply system 22. Also, the temperature controller 52 adjusts the workpiece heater 54, in order to set the temperature of the workpiece W mounted on the chuck 16. An atmosphere handler controller 38, in response to a signal from the control system 30, sends an input signal to a remote atmosphere handler 40 directing the air handler 40 to set the temperature within the chamber 12. The photoresist heater 50 and the workpiece heater 54 can be of any conventional design so long as the photoresist and workpiece temperatures can be controlled within desired tolerances. The chamber atmosphere temperature is set by the remote atmosphere handler 40 described above. Chamber temperature and humidity sensors 34 and 36 and the feedback sensors (not shown) are operationally coupled to the control system 30 in a conventional manner for feedback control to ensure that desired temperature levels are maintained within tolerances.

A method for forming a photoresist coating having a uniform thickness using the liquid coating device of FIG. 2 will be described below.

The operation of the device 10 depicted in FIG. 2 would be similar to the general operation of the device 10 depicted in FIG. 1. The chamber humidity and spin speed are set at particular values. For these values, reference data giving photoresist thickness as a function of photoresist temperature, wafer temperature, and chamber temperature over a range of barometric pressure conditions is obtained empirically as described above. Based on this reference data, the photoresist, wafer, and chamber temperatures are set at initial values effective to achieve a desired photoresist thickness for convenient-chamber humidity and spin speed settings and a nominal barometric pressure. The photoresist, wafer, and chamber temperatures are varied in a concerted fashion by an amount determined by formulaic analysis, look-up table, or the like using the reference data and the measured barometric pressure.

In such a liquid coating device 10, the wafer W is chucked, rotated, and photoresist is dropped as described above. If the barometric pressure in the chamber 12 is higher than an optimal barometric pressure for forming a photoresist coating 60 having a desired mean coating thickness, the barometric pressure sensor 24 detects the higher barometric pressure and sends an output signal to the control system 30. The control system 30 would then derive from information comprising the sensed barometric pressure and corresponding reference data an amount by which to increase the photoresist, wafer, and chamber temperatures. In accordance with this amount, the control system 30 sends an output signal to the temperature controller 52 and the atmosphere handler controller 38. The temperature controller 52 and the atmosphere handler 38 increase the temperatures of the photoresist heater 50, the chuck heater 54, and the remote atmosphere handler 40 by the amount derived by the control system 30. Higher temperatures tend to produce a thicker photoresist coating 60. Therefore, as a result of the higher temperatures, the mean coating thickness of the photoresist coating 60 increases to the desired mean coating thickness as shown in FIG. 3.

Similarly, if the barometric pressure in the chamber 12 is lower than the optimal barometric pressure, the barometric pressure sensor 24 detects the lower barometric pressure and sends an output signal to the control system 30. The control system 30 would then derive from information comprising the sensed barometric pressure and corresponding reference data an amount by which to decrease the photoresist, wafer, and chamber temperatures. In accordance with this amount, the control system 30 sends an output signal to the temperature controller 52, the atmosphere handler controller.38. The temperature controller 52 and atmosphere handler controller 38 decrease the temperatures of the photoresist heater 50, the chuck heater 54 and the remote atmosphere handler 40 by the amount derived by the control system 30. Lower temperatures tend to produce a thinner photoresist coating 60. Therefore, as a result of the lower temperatures, the mean coating thickness of the photoresist coating 60 decreases to the desired coating thickness shown in FIG. 3.

Figure 6:
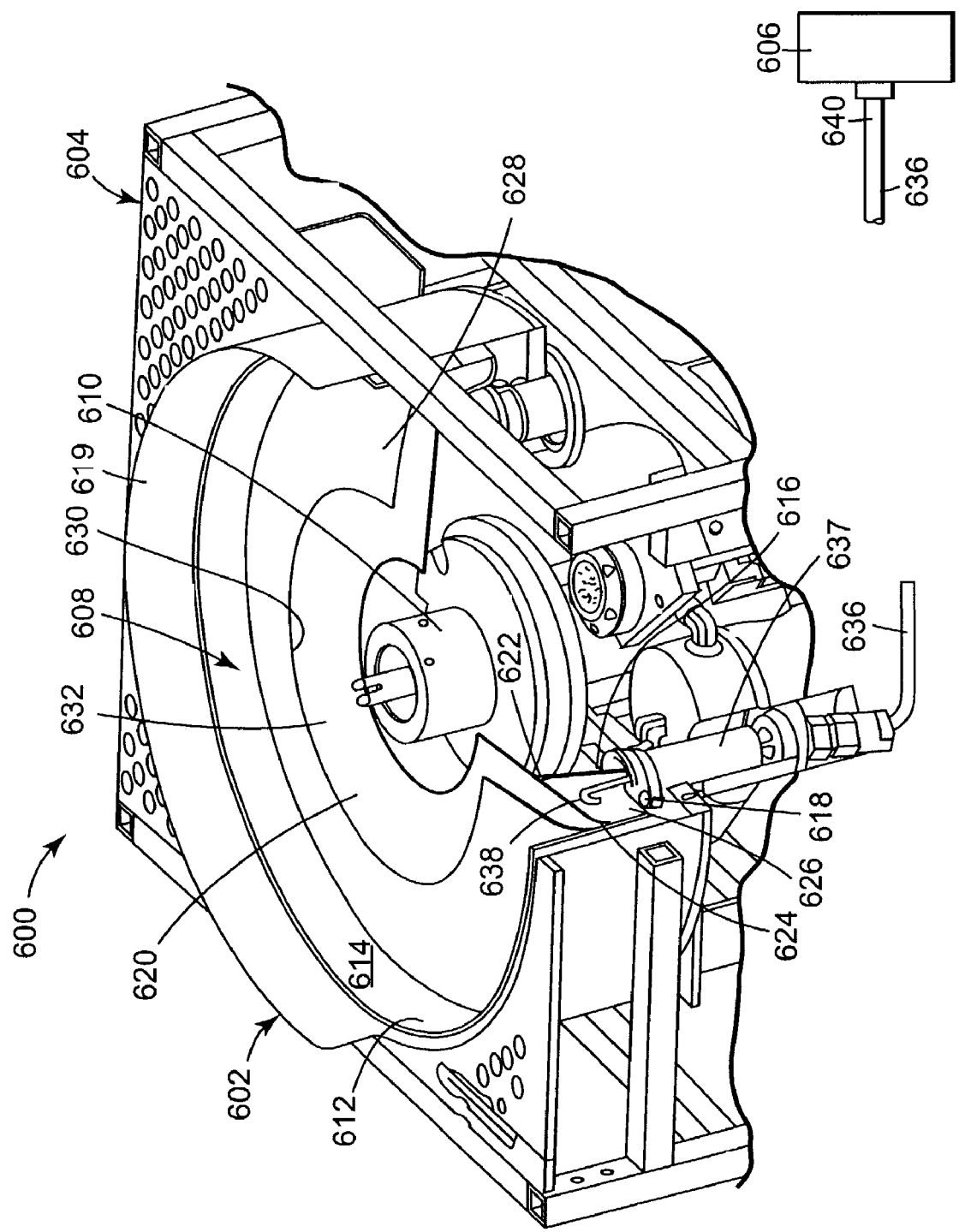
FIG. 6 is a perspective view, in partial cross section, of a spin coating device according to an alternative embodiment of the present invention.

As mentioned hereinabove, the barometric pressure sensor is desirably located so as to be capable of measuring some parameter indicative of the barometric pressure within the coating cup itself, while yet being in a shrouded position so as to reduce or eliminate the effects of air flow upon the sensor. One way of achieving the accurate measurement desired, while yet reducing or eliminating air flow effects, is to position the barometric pressure sensor outside of the environmental chamber and to couple the sensor to the interior of the cup by way of a pressure communicative conduit. Thus, the actual barometric pressure proximal to the coating operation is measured without subjecting the sensor to air flow effects. FIG. 6 illustrates this embodiment of the present invention.

FIG. 6 shows a perspective view, in partial cross-section, of a coating module 600 incorporating the aforementioned principles and thus being capable of achieving the aforementioned objectives. Coating module 600 generally includes coating enclosure 602 mounted in supporting frame structure 604. Coating module 600 is adapted to provide for the placement of pressure sensor 606 in a position exterior to the coating enclosure 602 while still providing accurate measurements of the actual barometric pressure within coating enclosure 602.

Coating enclosure 602 includes cup assembly 608 fit around motorized shaft assembly 610. In operation, a semiconductor wafer (not shown) is mounted inside cup assembly 608 by means of vacuum suction or the like onto a turntable (not shown) that is rotatably driven by motorized shaft assembly 610. Cup assembly 608 includes bowl 612, baffle 620, and deflector 628 supported inside container 619. Bowl 612, baffle 620, and deflector 628 are easily removed, from container 619 for cleaning or other service.

Bowl 612 has an annular shape to fit around motorized shaft assembly 610 and includes outer wall 614, inner wall 616, and bottom 618. Bowl 612 fits snugly into container 619 of coating enclosure 602. Annular baffle 620 is releasably mounted onto bowl 612. To help hold baffle 620 in position on bowl 612, flange 622 of baffle 620 engages inner wall 616 of bowl 612 with a close-fit engagement. Distal edge 624 of baffle 620 curves downward toward outer wall 614 to help cause excess processing fluid to drain downward into drain region 626. Annularly shaped deflector 628 is positioned in bowl 612 over baffle 620. Inner circumference 630 of deflector 628 defines opening 632 through which a semiconductor wafer can be inserted or removed from coating enclosure 602 to carry out coating operations. The space between deflector 628 and baffle 620 defines pocket 634 for catching overspray as thrown off of the spinning wafer during coating operations.

A pressure communicative conduit in the form of tubing 636 extends from drain region 626 to pressure sensor 606. First end 638 of tubing 636 is curved downward to help prevent processing fluid from getting into tubing 636. First end 638 of tubing 636 is secured in position by fitting 637. Distal end 640 of tubing 636 is operationally coupled to pressure sensor 606. As a result, even though pressure sensor 606 is positioned outside of coating enclosure 602, the pressure sensed by pressure sensor 606 is the actual barometric pressure in the drain region 626 between baffle 620 and bowl 612, inside of cup assembly 608. Advantageously, the placement of pressure communicative conduit 636 and its relationship to pressure sensor 606 allows such a measurement to be obtained inside of cup assembly 608, while minimizing, or substantially eliminating, the effects of air flow and turbulence that may otherwise impact such a measurement. Furthermore, the shape of the tubing 636 of the pressure communicative conduit can prevent the flow of processing fluid from interfering with the measurement, thus further enhancing the accuracy thereof.

In a preferred mode of operation of a coating device incorporating coating module 600, chamber humidity, temperature, photoresist temperature and wafer temperatures are set at particular values as described hereinabove with respect to FIG. 1. A wafer (not shown) is then mounted on motorized shaft assembly 610 so that the wafer is partially enclosed by cup assembly 608. A predetermined amount of the photoresist (not shown) at a predetermined temperature is supplied from a photoresist supply (not shown) and dropped on the center of the wafer while the wafer is caused to rotate at an initial preselected speed. One or more process parameters, such as spin speed, ramp speed profile, combinations of these and the like as described above, can be controlled in response to pressure measurements in order to obtain a coating of the desired thickness. Advantageously, due to the placement of pressure communicative conduit 636, the measured pressure is substantially indicative of the pressure within coating enclosure 602.

Other embodiments of this invention will be apparent to those skilled in the art upon consideration of this specification or from practice of the invention disclosed herein. For example, the present invention can be applied to other processes that coat a coatable composition to form a coating having a uniform thickness such as spin coating of dielectrics or dopants in semiconductor fabrication. Various omissions, modifications, and changes to the principles and embodiments described herein may be made by one skilled in the art without departing from the true scope and spirit of the invention which is indicated by the following claims.

What is claimed is:

1. A system for using a fluid composition to form a coating of a desired thickness on a surface of a workpiece, comprising:
    (a) a processing chamber;
    (b) a coating enclosure inside the processing chamber, wherein the workpiece is rotatably supported inside the coating enclosure during coating operations;
    (c) a dispenser for delivering a predetermined amount of the fluid composition to the surface of the workpiece;
    (d) a pressure sensor positioned outside the coating enclosure;
    (e) a pressure communicative fluid conduit operatively coupling the pressure sensor to the interior of the coating enclosure such that a pressure signal generated by the pressure sensor, at a time during which the workpiece is being rotated, is indicative of barometric pressure inside the coating enclosure;
    (f) a control system operatively coupled to the pressure sensor and configured to control at least one coating thickness parameter via an output control signal, wherein the control system comprises componentry enabling the control system to derive the output control signal from information comprising the generated pressure signal.

2. The system of claim 1, further comprising a support surface positioned inside the coating enclosure on which the workpiece is rotatably supported.

3. The system of claim 2, wherein the at least one coating thickness parameter is selected from the group consisting of fluid composition temperature, spin speed of the workpiece, workpiece temperature, coating enclosure temperature, process timing delay, acceleration of the workpiece, spin duration of the workpiece, and combinations thereof.

4. The system of claim 3, wherein the at least one coating thickness parameter is selected from spin speed and process timing delay.

5. The system of claim 1, wherein the pressure communicative fluid conduit comprises a first end having an inlet positioned inside the coating enclosure and a second end operatively coupled to the pressure sensor.

6. The system of claim 5, wherein the first end of the pressure communicative fluid conduit comprises an elbow to inhibit egress of the fluid composition into the pressure communicative conduit.

7. The system of claim 1, wherein the componentry of the control system comprises hardware, software or a combination thereof and wherein the output signal further comprises a correlation between a coating thickness and the generated pressure signal.

8. The system of claim 1 wherein the system comprises a spin coater.

9. The system of claim 8 wherein the coating is a photoresist.

10. A system for using a fluid composition to form a coating of a desired thickness on a surface of a workpiece, comprising:
(a) a processing chamber;
(b) a coating enclosure inside the processing chamber, wherein the workpiece is rotatably supported inside the coating enclosure during coating operations;
(c) a dispenser for delivering a predetermined amount of the fluid composition to the surface of the workpiece;
(d) a pressure sensor positioned outside the coating enclosure;
(e) a pressure communicative fluid conduit operatively coupling the pressure sensor to the interior of the coating enclosure such that a pressure signal generated by the pressure sensor is indicative of the pressure inside the coating enclosure;
(f) a control system operatively coupled to the pressure sensor and configured to control at least one coating thickness parameter via an output control signal, wherein the control system comprises componentry enabling the control system to derive the output control signal from information comprising the generated pressure signal; and
(g) wherein the coating thickness parameter is selected from the group consisting of fluid composition temperature, workpiece temperature, coating enclosure temperature, spin speed of the workpiece, spin duration of the workpiece, a process timing delay, and combinations thereof.

11. The system of claim 10, wherein the coating thickness parameter is the spin speed of the workpiece.

12. The system of claim 10 wherein the coating thickness parameter is a process timing delay.

13. The system of claim 10 wherein the coating is a photoresist.

14. The system of claim 13 wherein the system comprises a spin coater, and wherein the pressure communicative fluid conduit comprises a first end having an inlet positioned inside the coating enclosure and a second end operatively coupled to the exteriorly positioned pressure sensor, and wherein the inlet of the first end comprises a structure formed to inhibit ingress of the fluid composition into the pressure communicative fluid conduit.

15. The system of claim 14 wherein the workpiece comprises a semiconductor wafer.

16. The system of claim 15 wherein the pressure signal is indicative of barometric pressure, at a time during which the workpiece is being rotated.

17. A system for using a fluid composition to form a coating of a desired thickness on a surface of a workpiece, comprising:
(a) a processing chamber;
(b) a coating enclosure inside the processing chamber, wherein the workpiece is rotatably supported inside the coating enclosure during coating operations;
(c) a dispenser for delivering a predetermined amount of the fluid composition to the surface of the workpiece;
(d) a pressure sensor positioned outside the coating enclosure;
(e) a pressure communicative fluid conduit operatively coupling the pressure sensor to the interior of the coating enclosure such that a pressure signal generated by the pressure sensor is indicative of the pressure inside the coating enclosure;
(f) a control system operatively coupled to the pressure sensor and adapted to control at least one coating thickness parameter via an output control signal, wherein the control system comprises componentry enabling the control system to derive the output control signal from information comprising the generated pressure signal;
(g) wherein the pressure communicative fluid conduit comprises a first end having an inlet positioned inside the coating enclosure and a second end operatively coupled to the exteriorly positioned pressure sensor; and
(h) wherein the inlet of the first end comprises a structure formed to inhibit ingress of the fluid composition into the pressure communicative conduit.

18. The system of claim 17 wherein the first end of the pressure communicative fluid conduit comprises an elbow to inhibit ingress of the fluid composition into the pressure communicative conduit.

19. The system of claim 17 wherein the pressure signal is indicative of barometric pressure, at a time during which the workpiece is being rotated.

20. The system of claim 19 wherein the system comprises a spin coater and the workpiece comprises a semiconducting wafer.

* * * * *